US010298867B2

(12) United States Patent
Takada et al.

(10) Patent No.: US 10,298,867 B2
(45) Date of Patent: May 21, 2019

(54) IMAGING DEVICE HAVING A PLURALITY OF PIXELS EACH WITH A PLURALITY OF PHOTOELECTRIC CONVERSION PORTIONS COVERED BY ONE MICROLENS OF A PLURALITY OF MICROLENSES

(71) Applicant: CANON KABUSHIKI KAISHA, Tokyo (JP)

(72) Inventors: Yoshiaki Takada, Kawasaki (JP); Masaaki Iwane, Sagamihara (JP); Shoji Kono, Hachioji (JP); Koichi Fukuda, Tokyo (JP); Junichi Saito, Kawasaki (JP); Yumi Takao, Nagareyama (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 0 days.

(21) Appl. No.: 15/991,788

(22) Filed: May 29, 2018

(65) Prior Publication Data

US 2018/0278871 A1 Sep. 27, 2018

Related U.S. Application Data

(63) Continuation of application No. 15/487,721, filed on Apr. 14, 2017, now Pat. No. 10,021,328.

(30) Foreign Application Priority Data

Apr. 22, 2016 (JP) .................................. 2016-086156

(51) Int. Cl.
*H04N 5/369* (2011.01)
*G02B 7/34* (2006.01)
(Continued)

(52) U.S. Cl.
CPC ............ *H04N 5/3696* (2013.01); *G02B 7/34* (2013.01); *H01L 27/1463* (2013.01);
(Continued)

(58) Field of Classification Search
CPC ...... H04N 5/3696; H04N 5/378; H04N 9/045; H04N 5/37457; H04N 2209/045;
(Continued)

(56) References Cited

U.S. PATENT DOCUMENTS

| 6,534,336 B1 | 3/2003 | Iwane |
| 7,935,995 B2 | 5/2011 | Watanabe |

(Continued)

FOREIGN PATENT DOCUMENTS

| JP | 2012-235444 | 11/2012 |
| JP | 2014-33054 | 2/2014 |
| JP | 2015-65269 | 4/2015 |

*Primary Examiner* — Padma Haliyur
(74) *Attorney, Agent, or Firm* — Venable LLP

(57) ABSTRACT

The imaging device includes a first pixel group and a second pixel group that include a plurality of pixels each having a plurality of photoelectric conversion portions that are separated by an isolation portion and arranged in a first direction and a plurality of transfer gates that transfer charges of the plurality of photoelectric conversion portions. A position of at least a part of the isolation portion within each of the pixels of the first pixel group and a position of at least a part of the isolation portion within each of the pixels of the second pixel group are shifted relative to each other in the first direction. Respective widths of portions where the plurality of separated photoelectric conversion portions overlap with the plurality of transfer gates in a planar view are the same.

12 Claims, 11 Drawing Sheets

(51) Int. Cl.
*H01L 27/146* (2006.01)
*H04N 5/378* (2011.01)
*H04N 5/3745* (2011.01)
*H04N 9/04* (2006.01)

(52) U.S. Cl.
CPC .. *H01L 27/14614* (2013.01); *H01L 27/14643* (2013.01); *H01L 27/14689* (2013.01); *H04N 5/378* (2013.01); *H04N 5/37457* (2013.01); *H04N 9/045* (2013.01); *H04N 2209/045* (2013.01)

(58) Field of Classification Search
CPC ......... H01L 27/14689; H01L 27/14643; H01L 27/1463; H01L 27/14614; G02B 7/34
See application file for complete search history.

(56) References Cited

U.S. PATENT DOCUMENTS

| | | |
|---|---|---|
| 7,973,271 B2 | 7/2011 | Toumiya |
| 8,111,311 B2 | 2/2012 | Iwane |
| 8,139,133 B2 | 3/2012 | Iwane |
| 8,222,682 B2 | 7/2012 | Watanabe |
| 8,325,260 B2 | 12/2012 | Yamazaki |
| 8,345,137 B2 | 1/2013 | Shinohara |
| 8,507,870 B2 | 8/2013 | Arishima |
| 8,530,989 B2 | 9/2013 | Kikuchi |
| 8,582,009 B2 | 11/2013 | Kono |
| 8,659,692 B2 | 2/2014 | Matsuda |
| 8,670,056 B2 | 3/2014 | Kong |
| 8,687,246 B2 | 4/2014 | Fujimura |
| 8,710,610 B2 | 4/2014 | Kono |
| 8,742,359 B2 | 6/2014 | Arishima |
| 8,810,706 B2 | 8/2014 | Yamazaki |
| 8,836,833 B2 | 9/2014 | Yamashita |
| 8,913,168 B2 | 12/2014 | Matsuda |
| 8,964,079 B2 | 2/2015 | Fukuda |
| 9,001,249 B2 | 4/2015 | Iwane |
| 9,049,392 B2 | 6/2015 | Itonaga |
| 9,053,996 B2 | 6/2015 | Iwane |
| 9,165,964 B2 | 10/2015 | Fukuda |
| 9,232,164 B2 | 1/2016 | Minowa |
| 9,426,391 B2 | 8/2016 | Takada |
| 9,497,403 B2 | 11/2016 | Iwane |
| 9,554,115 B2 | 1/2017 | Agranov |
| 9,577,006 B2 | 2/2017 | Itonaga |
| 9,627,423 B2 | 4/2017 | Takada |
| 2011/0273597 A1 | 11/2011 | Ishiwata |
| 2012/0008030 A1 | 1/2012 | Kono |
| 2012/0262613 A1 | 10/2012 | Kono |
| 2014/0340555 A1 | 11/2014 | Iwane |
| 2016/0057372 A1 | 2/2016 | Iwane |
| 2016/0234449 A1 | 8/2016 | Ishiwata |
| 2017/0048474 A1 | 2/2017 | Nakamura |

IMAGING DEVICE HAVING A PLURALITY OF PIXELS EACH WITH A PLURALITY OF PHOTOELECTRIC CONVERSION PORTIONS COVERED BY ONE MICROLENS OF A PLURALITY OF MICROLENSES

This application is a continuation of application Ser. No. 15/487,721, filed Apr. 14, 2017.

BACKGROUND OF THE INVENTION

Field of the Invention

The present invention relates to an imaging device, an imaging system, and a manufacturing method of the imaging device.

Description of the Related Art

In CMOS solid state imaging devices, a pupil division phase difference scheme has been proposed as one of the schemes for detecting a focus. Japanese Patent Application Laid-open No. 2012-235444 discloses a configuration that shifts the position dividing photoelectric conversion portions of the first pixel and the second pixel of an image capturing pixel group or selects the number of divisions in an x-direction and the number of divisions in a y-direction to be co-prime. This configuration is intended to suppress an influence of a low sensitive band occurring due to the division of photoelectric conversion portions.

In order to perform accurate focus detection in an imaging device of the pupil division phase difference scheme, it is necessary to divide an incident light from imaging optics into pupils in a symmetrical manner and guide the divided lights to paired photoelectric conversion portions. When pixels having equally divided photoelectric conversion portions only are provided, however, it will be difficult to guide an incident light to the paired photoelectric conversion portions in a symmetrical manner when the incident light is a high incident-angle light to a short pupil distance lens, in particular, in a peripheral image height.

As one of the solutions to this problem, it appears to be effective to shift the dividing position of the photoelectric conversion portions. However, a shift of the dividing position of the photoelectric conversion portions causes a difference of charge transfer characteristics or degradation of charge transfer characteristics of the paired photoelectric conversion portions and thus results in a reduction in the focus detection accuracy. Further, when the pupil division pixel for focus detection also serves as an image capturing pixel, this may cause a problem of a reduction in image capturing characteristics. Although Japanese Patent Application Laid-open No. 2012-235444 discloses photoelectric conversion portions divided into unequal parts by isolation portions, there is no reference to the above problems.

The present invention has been made in view of the above problems and intends to improve a focus detection accuracy without causing degradation of image capturing characteristics in an imaging device with a pupil division phase difference scheme.

SUMMARY OF THE INVENTION

An imaging device in one embodiment of the present invention includes: a plurality of pixels each having a first photoelectric conversion portion and a second photoelectric conversion portion arranged adjacent along a first direction; an isolation portion arranged between the first photoelectric conversion portion and the second photoelectric conversion portion; a first transfer gate that transfers charges of the first photoelectric conversion portion; and a second transfer gate that transfers charges of the second photoelectric conversion portion, wherein, the first photoelectric conversion portion has a first portion and a second portion, the second portion is located at a greater distance from the first transfer gate in a second direction than the first portion is, and the second direction is different from the first direction, the second photoelectric conversion portion has a third portion arranged in the same position as the first portion in the second direction and a fourth portion arranged in the same position as the second portion in the second direction, a width in the first direction of the first portion defined by the isolation portion is greater than a width in the first direction of the second portion defined by the isolation portion, a width in the first direction of the second portion defined by the isolation portion is less than a width in the first direction of the fourth portion defined by the isolation portion, and a position of the isolation portion between the first portion and the third portion is different from a position of the isolation portion between the second portion and the fourth portion in the first direction.

An imaging device in another embodiment of the present invention includes: a plurality of pixels each having a first photoelectric conversion portion and a second photoelectric conversion portion separated from each other by an isolation portion and arranged adjacent along a first direction, a first transfer gate that transfers charges of the first photoelectric conversion portion, and a second transfer gate that transfers charges of the second photoelectric conversion portion, in which, a difference between a width in a direction crossing a charge transfer direction of a portion where the first photoelectric conversion portion overlaps with the first transfer gate in a planar view and a width in a direction crossing a charge transfer direction of a portion where the second photoelectric conversion portion overlaps with the second transfer gate in a planar view is smaller than a difference between a length of the first photoelectric conversion portion and a length of the second photoelectric conversion portion on a line traversing the isolation portion in the first direction.

A manufacturing method of an imaging device in another embodiment of the present invention is a manufacturing method of an imaging device including a first pixel group and a second pixel group each including a plurality of pixels, each of the pixels having a plurality of photoelectric conversion portions and a plurality of transfer gates that transfer charges of the plurality of photoelectric conversion portions, the manufacturing method comprising steps of: forming the plurality of transfer gates on a semiconductor substrate; forming a resist pattern such that the photoelectric conversion portions are separated into multiple parts in a first direction by an isolation portion, wherein (i) a position of at least a part of the isolation portion in each of the pixels of the first pixel group and a position of at least a part of the isolation portion in each of the pixels of the second pixel group are shifted from each other in the first direction, (ii) respective widths of portions where the plurality of photoelectric conversion portions overlap with the plurality of transfer gates in a planar view are the same, and (iii) the isolation portion includes a first isolation section and a second isolation section, the second isolation section is located closer to a transfer gate than the first isolation section is, and the second isolation section equally separates the photoelectric conversion portions; and after forming the transfer gate and the resist pattern, implanting ions from an implantation direction having a non-zero-degree tilt angle relative to a normal direction of the semiconductor substrate, in which a length of the first isolation section is greater than h×tan θ×cos α, where the tilt angle is denoted as θ, an angle of a projecting direction of the implantation direction on a surface of the semiconductor substrate relative to a gate length direction of the transfer gate is denoted as α, and a film thickness of the resist pattern at the step of implanting ions is denoted as h.

Further features of the present invention will become apparent from the following description of exemplary embodiments with reference to the attached drawings.

DESCRIPTION OF THE EMBODIMENTS

Preferred embodiments of the present invention will now be described in detail in accordance with the accompanying drawings.

First Embodiment

Figure 1:
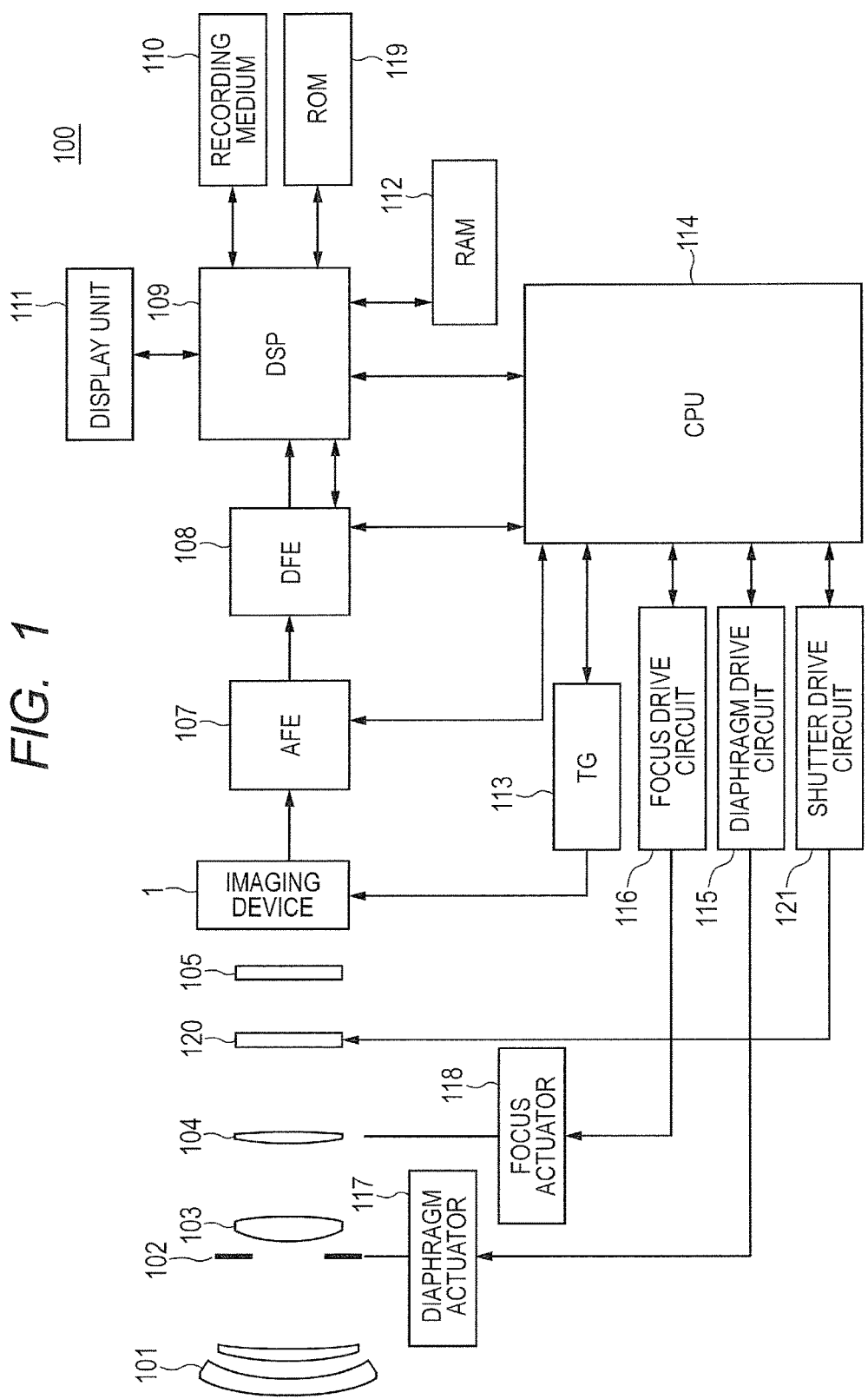
FIG. 1 is a block diagram of an imaging system of a first embodiment.

FIG. 1 is a block diagram of an imaging system 100 having an imaging device 1 of the first embodiment. The imaging system 100 may be any type of apparatus such as a still camera, a video camera, a smartphone, a tablet computer, or the like as long as it has an image capturing function. As illustrated in FIG. 1, imaging optics include a first lens set 101, a diaphragm 102, a second lens set 103, a third lens set 104, and an optical low-pass filter 105. The first lens set 101 is arranged at the front end of the imaging optics and held in a retractable manner in an optical axis direction. The diaphragm 102 performs light amount adjustment by adjusting an aperture thereof when a capturing is performed. The second lens set 103 implements a variable magnification effect (a zoom function) working together with expansion and retraction of the first lens set 101. The third lens set 104 performs focus adjustment by back-and-forth movement in the optical axis direction.

The optical low-pass filter 105 is an optical element for reducing false color or moire of a captured image. The imaging device 1 photoelectrically converts (captures) an object image formed by the lens sets 101, 103, and 104 to generate an image signal (pixel signal). In this example, the imaging device 1 is a solid state imaging device such as a CMOS image sensor with a pupil division phase difference scheme.

An analog image signal output from the imaging device 1 is converted into a digital signal (image data) by an analog front end (AFE) 107. A digital front end (DFE) 108 applies a predetermined calculation process to image data. A digital signal processor (DSP) 109 is a signal processor that performs a correction process, a development process, and the like on image data input from the DFE 108. Further, the DSP 109 performs autofocus (AF) calculation that calculates a focus displacement from image data.

Image data is recorded in a recording medium 110. A display unit 111 is used for displaying a captured image, various menu windows, or the like, and a liquid crystal display (LCD) or the like is used. A RAM 112 temporarily stores image data or the like and is connected to the DSP 109. A timing generator (TG) 113 supplies a drive signal to the imaging device 1.

A CPU (a controller, a control unit) 114 controls the AFE 107, the DFE 108, the DSP 109, the TG 113, a diaphragm drive circuit 115, and a shutter drive circuit 121. Further, the CPU 114 controls a focus drive circuit 116 based on an AF calculation result of the DSP 109. An operation program of the CPU 114 is stored in a ROM 119 or a memory (not depicted).

The diaphragm drive circuit 115 drives the diaphragm 102 by driving and controlling a diaphragm actuator 117. The focus drive circuit 116 causes the third lens set 104 to move back and forth in the optical axis direction by driving and controlling a focus actuator 118 and thereby performs focus adjustment. The ROM 119 stores various correction data or the like. The mechanical shutter 120 controls the amount of exposure to the imaging device 1 in a static image capturing. A mechanical shutter 120 holds an opening state during a live view operation and a motion image capturing to keep a state of exposure to the imaging device 1. The shutter drive circuit 121 controls the mechanical shutter 120.

Figure 2:
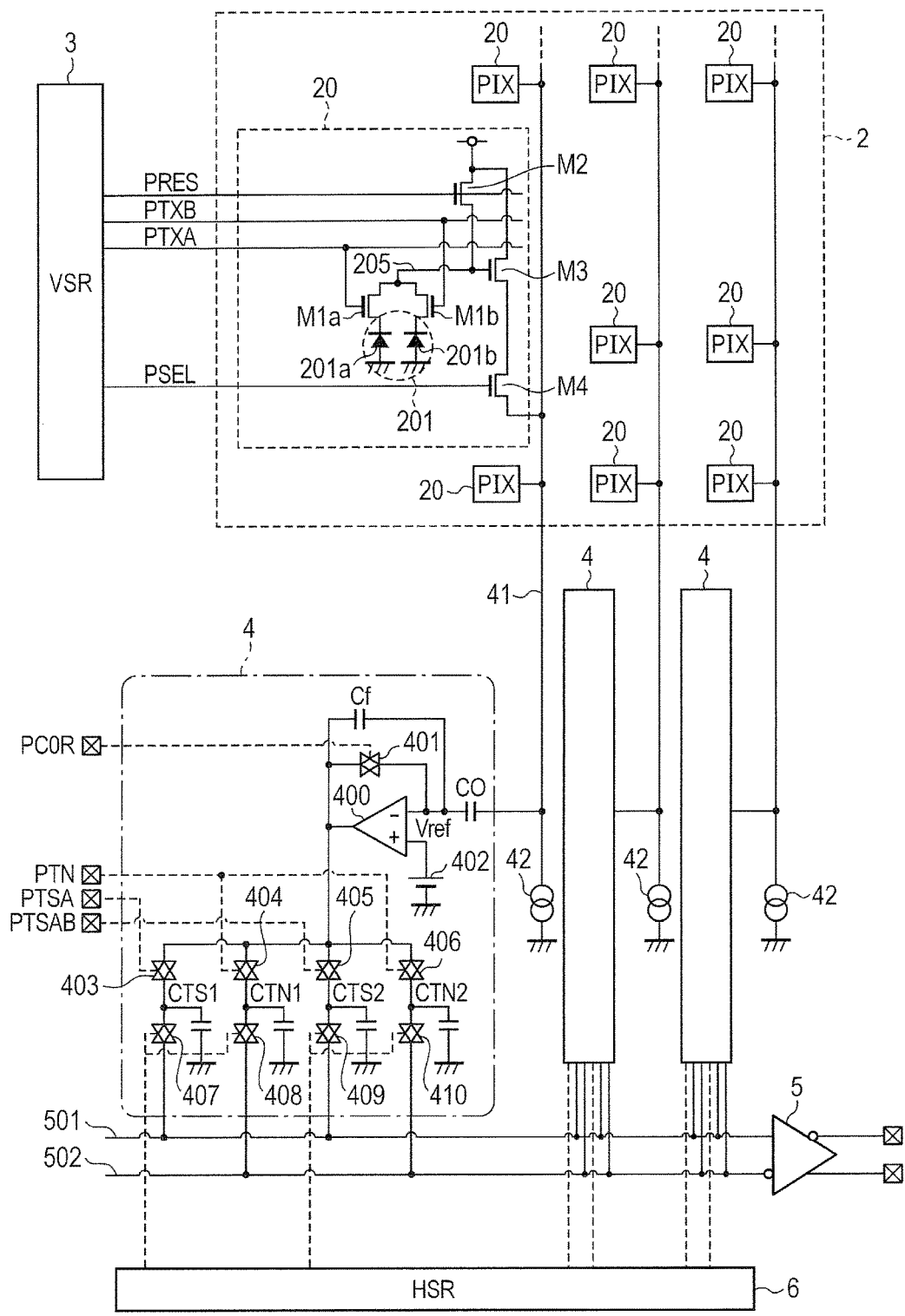
FIG. 2 is a block diagram of an imaging device of the first embodiment.

FIG. 2 is a block diagram of the imaging device 1 of the present embodiment. The imaging device 1 has a pixel unit 2, a vertical scanning circuit (VSR) 3, column amplification circuits 4, an output amplifier 5, and a horizontal scanning circuit (HSR) 6. The pixel unit 2 has a plurality of pixels aligned in a two-dimensional matrix in a row direction and a column direction. Note that, in the present specification, the row direction refers to the horizontal direction in the drawings, and the column direction refers to the vertical direction in the drawings. Although FIG. 2 depicts pixels of three rows by three columns for simplified illustration, the number of pixels is not limited thereto. Note that a part of pixels may be an optical black (OB) pixel to be shielded.

Each pixel 20 has first and second photoelectric conversion portions 201a and 201b, first and second transfer transistors M1a and M1b, a floating diffusion region 205, a reset transistor M2, an amplification transistor M3, and a selection transistor M4. Each of the first photoelectric conversion portion 201a and the second photoelectric conversion portion 201b is formed of a photodiode. The following description illustrates an example in which transistors of the pixel 20 are N-channel MOS transistors. A micro lens is provided over the photoelectric conversion portions 201a and 201b, and a light concentrated by the micro lens enters the photoelectric conversion portions 201a and 201b. In such a way, two photoelectric conversion portions 201a and 201b form a photoelectric conversion unit 201 having divided pupils. Note that the number of photoelectric conversion portions forming the photoelectric conversion unit 201 is not limited to two and may be two or more.

The transfer transistors M1a and M1b are provided associated with the photoelectric conversion portions 201a and 201b and drive pulses PTXA and PTXB are applied to respective gates thereof. In response to the drive pulses PTXA and PTXB being high level, the transfer transistors M1a and M1b are turned on (in a conductive state), and signals of the photoelectric conversion portions 201a and 201b are transferred to the floating diffusion region 205 that is an input node of the amplification transistor M3. Then, in response to the drive pulses PTXA and PTXB being low level, the transfer transistors M1a and M1b are turned off (in a non-conductive state). By turning on or off the transfer transistors M1a and M1b, charges of the photoelectric conversion portions 201a and 201b can be independently transferred to the floating diffusion region 205. The amplification transistor M3 outputs, to a column signal line 41, a signal based on charges transferred to the floating diffusion region 205.

The source of the reset transistor M2 is connected to the floating diffusion region 205, and a drive pulse PRES is applied to the gate thereof. In response to the drive pulse PRES being high level, the reset transistor M2 is turned on and a reset voltage is supplied to the floating diffusion region 205. The selection transistor M4 is provided between the amplification transistor M3 and the column signal line 41, and a drive pulse PSEL is applied to the gate of the selection transistor M4. In response to the drive pulse PSEL being high level, the amplification transistor M3 and the column signal line 41 are electrically conducted.

The column signal lines 41 are provided on a column basis, and current sources 42 are electrically connected to respective column signal lines 41. Each current source 42 supplies a bias current to the source of each amplification transistor M3 via each column signal line 41, and the amplification transistor M3 operates as a source follower.

The vertical scanning circuit 3 supplies drive pulses to respective gates of the transfer transistors M1a and M1b, the reset transistor M2, and the selection transistor M4 on each row. The drive pulses are supplied on a row basis, sequentially or at random. The vertical scanning circuit 3 is able to perform a readout mode which causes either one of the transfer transistors M1a and M1b to be in a conductive state and another readout mode which causes both of the transfer transistors M1a and M1b to be in a conductive state.

The column amplification circuits 4 as readout circuits are provided on a column basis and connected to column signal lines 41 directly or via switches. Each column amplification circuit 4 has an operational amplifier 400, a reference voltage source 402, an input capacitor C0, a feedback capacitor Cf, holding capacitors CTS1, CTS2, CTN1, and CTN2, and switches 401 and 403 to 410.

A first node of the input capacitor C0 is electrically connected to the column signal line 41, and a second node is electrically connected to the inverting input node of the operational amplifier 400. A first node of the feedback capacitor Cf is electrically connected to the inverting input node of the operational amplifier 400 and the second node of the input capacitor C0. A second node of the feedback capacitor Cf is electrically connected to the output node of the operational amplifier 400.

The switch 401 is provided in parallel to the feedback capacitor Cf and controls electrical connection of a feedback path between the inverting input node and the output node of the operational amplifier 400. When the switch 401 is turned off, the operational amplifier 400 performs inverting amplification of a signal on the column signal line 41 at a gain defined by a ratio of the capacitance of the input capacitor C0 and the capacitance of the feedback capacitor Cf. When the switch 401 is turned on, the operational amplifier 400 operates as a voltage follower. The reference voltage source 402 supplies the reference voltage Vref to the non-inverting input node of the operational amplifier 400. The inverting input node and the non-inverting input node of the operational amplifier 400 are virtually short-circuited and thereby the voltage of the inverting input node also becomes the reference voltage Vref.

An output of the operational amplifier 400 is output to the holding capacitors CTS1, CTS2, CTN1, and CTN2 via the switches 403 to 406, respectively. The holding capacitors CTS1, CTS2, CTN1, and CTN2 are capacitors that hold an output from the operational amplifier 400. A brightness signal at photoelectric conversion of the photoelectric conversion portion 201a is held in the holding capacitor CTS1 and brightness signals at photoelectric conversion of the photoelectric conversion portions 201a and 201b are held in the holding capacitor CTS2. A signal at resetting is held in the holding capacitors CTN1 and CTN2. The switches 403 to 406 are provided on electrical lines between the holding capacitors CTS1, CTS2, CTN1, and CTN2 and the operational amplifier 400, respectively, and controls electrical conduction between the output node of the operational amplifier 400 and the holding capacitors CTS1, CTS2, CTN1, and CTN2. The switch 403 is controlled by a drive pulse PTSA, and the switch 405 is controlled by a drive pulse PTSAB. Further, the switches 404 and 406 are controlled by a drive pulse PTN.

The switches 407 to 410 are turned on based on signals from the horizontal scanning circuit 6 and output respective signals held in the holding capacitors CTS1, CTS2, CTN1, and CTN2 to horizontal output lines 501 and 502. Brightness signals held in the holding capacitors CTS1 and CTS2 are output to the horizontal output line 501, and reset signals held in the holding capacitors CTN1 and CTN2 are output to the horizontal output lines 502. The output amplifier 5 includes a differential amplifier and outputs a difference of signals on the horizontal output lines 501 and 502 to the outside. That is, a signal in which a noise component has been removed from a brightness signal by using correlated double sampling (CDS) is output from the output amplifier 5. Note that CDS may be performed outside the imaging device without being performed in the output amplifier 5. The horizontal scanning circuit 6 has a shift resistor and outputs signals from the column amplification circuit 4 to the horizontal output lines 501 and 502 by sequentially supplying drive pulses to the column amplification circuit 4. The configuration described above allows for obtaining an (A+B) signal, which is an addition of the respective signals of the photoelectric conversion portions 201a and 201b, and an A signal of the photoelectric conversion portion 201a. The (A+B) signal is used as an image signal. A B signal of the photoelectric conversion portion 201b can be calculated by subtracting the A signal from the (A+B) signal. Note that the B signal may be separately read out from the photoelectric conversion portion 201b without performing subtraction. The A signal and the B signal are used as a focus detection signal for phase difference detection.

Figure 3:
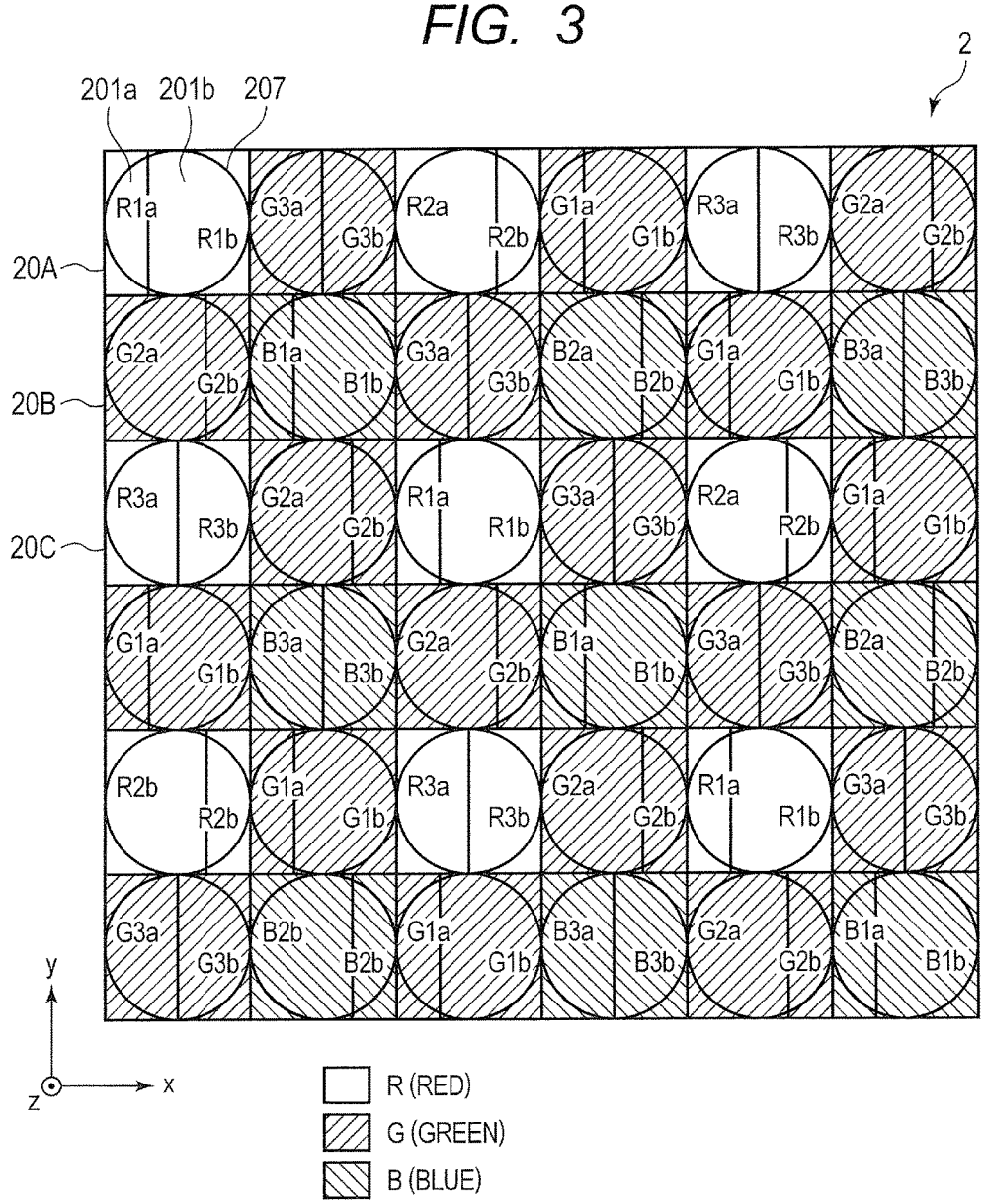
FIG. 3 is a schematic diagram of a pixel arrangement of a pixel unit of the first embodiment.

FIG. 3 is a schematic diagram of a pixel arrangement of the pixel unit 2 of the present embodiment and depicts pixels 20 of six columns by six rows. Multiple sets of the pixel arrangement of six columns by six rows illustrated in FIG. 3 are repeatedly arranged on a surface, allowing for acquisition of a high resolution image. Color filters are arranged in a pixel unit 2 according to the Bayer arrangement and, on the pixels 20 on odd-numbered rows, color filters of R (red) and G (green) are arranged in this order from the left in an alternating manner. Further, on the pixels 20 on even-numbered rows, color filters of G and B (blue) are arranged in this order from the left in an alternating manner. Note that, the advantage of the present invention can be obtained in a case of a monochrome imaging device, and thus color filters are not necessarily required. Further, complementary colors such as cyan, magenta, yellow, and the like may be used.

Each of the pixels 20 has a plurality of photoelectric conversion portions 201a and 201b, which are separated from each other by isolation portions, and a micro lens 207. The photoelectric conversion portion 201a and the photoelectric conversion portion 201b share a single micro lens 207. In the present embodiment, the photoelectric conversion portion 201a and the photoelectric conversion portion 201b of each of all the pixels 20 are divided into two in the horizontal direction as a first direction (+x-direction or −x-direction) and aligned in the horizontal direction. Output signals of the divided (separated) photoelectric conversion portions 201a and 201b can be read out independently. The pixel unit 2 comprises a first pixel group, a second pixel group, and a third pixel group that are different in the pupil division pattern. A position of at least a part of an isolation portion in each pixel of any one of the first to third pixel groups is shifted in the dividing direction (the first direction) relative to a position of at least a part of an isolation portion in each pixel of the remaining pixel groups. Note that, in the following description, while the horizontal direction (+x-direction or −x-direction) is defined as the dividing direction (the first direction), the vertical direction (+y-direction or −y-direction) may be defined as the dividing direction.

In each pixel 20A of the first pixel group, the dividing position between the photoelectric conversion portion 201a (R1a, G1a, B1a) and the photoelectric conversion portion 201b (R1b, G1b, B1b) is shifted in the −x-direction relative to the dividing positions in the pixels 20B and 20C of the second and third pixel groups. Further, in each pixel 20B of the second pixel group, each dividing position between the photoelectric conversion portion 201a (R2a, G2a, B2a) and the photoelectric conversion portion 201b (R2b, G2b, B2b) is shifted in the +x-direction relative to the dividing positions in the first and third pixel groups. In each pixel 20C of the third pixel group, each dividing position between the photoelectric conversion portion 201a (R3a, G3a, B3a) and the photoelectric conversion portion 201b (R3b, G3b, B3b) is on the pixel center line.

Figure 4A:
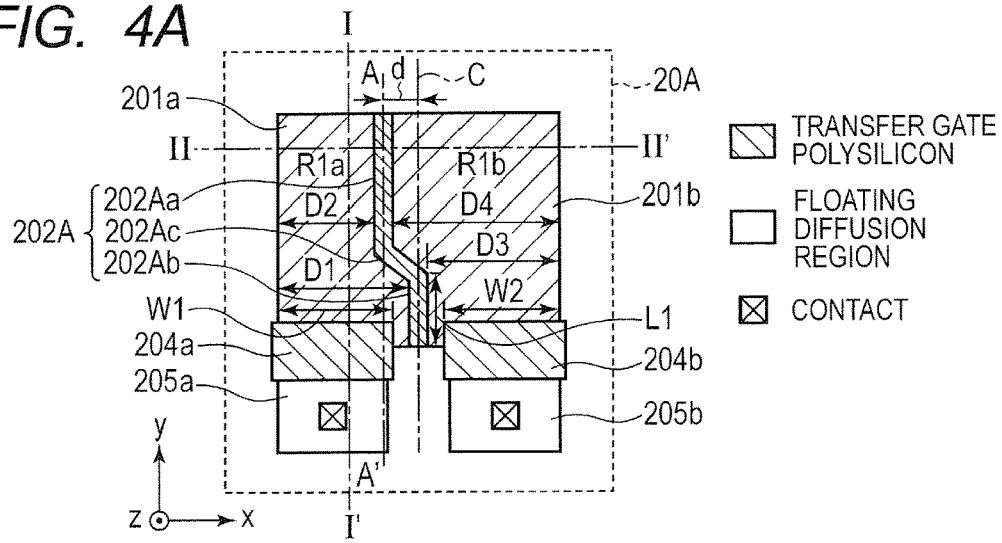
FIG. 4A, FIG. 4B and FIG. 4C are schematic diagrams of pupil division patterns of the first embodiment.
Figure 4B:
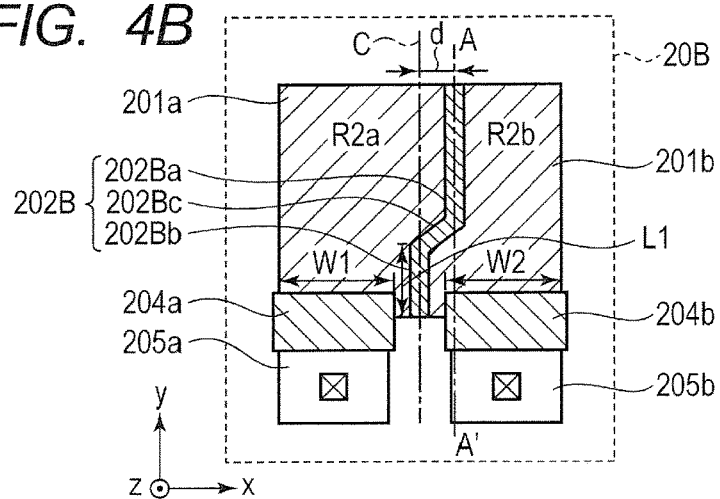
Figure 4C:
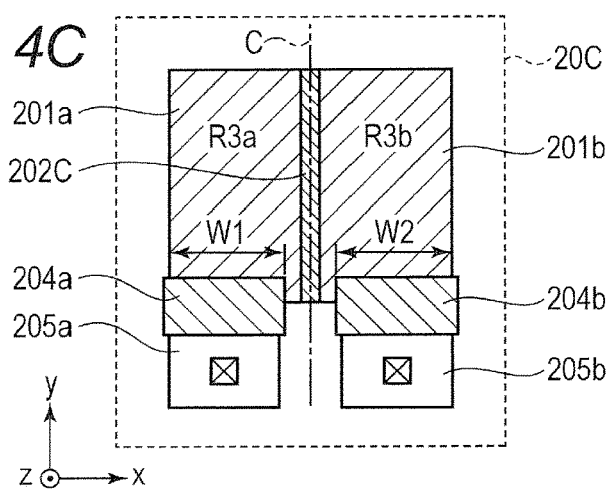

FIG. 4A to FIG. 4C are schematic diagrams of pupil division patterns of a pixel of the first embodiment and illustrates a part of the pixel in a planar view. FIG. 4A illustrates a pupil division pattern of the pixel 20A of the first pixel group. In the pixel 20A of the first pixel group, the photoelectric conversion portions 201a (R1a, G1a, B1a) and 201b (R1b, G1b, B1b) are divided from each other by an isolation portion 202A and aligned in the x-direction (the first direction). The isolation portion 202A comprises first to third isolation sections 202Aa to 202Ac. The first isolation section 202Aa is shifted by a distance d in the horizontal direction (−x-direction) with respect to the pixel center line C. That is, the difference between the length of the first photoelectric conversion portion 201a and the length of the second photoelectric conversion section 201b on a line traversing the first isolation section 202Aa in the first direction is the distance d. The second isolation section 202Ab is located on the pixel center line C, and the third isolation section 202Ac connects the first isolation section 202Aa to the second isolation section 202Ab. The second isolation section 202Ab is located closer to transfer gate polysilicon 204a and 204b than the isolation sections 202Aa and 202Ac are. The second isolation section 202Ab is located on the pixel center line C and equally divides the photoelectric conversion portions 201a and 201b. Here, the pixel center line C is a virtual line that equally divides the photoelectric conversion unit 201 in the horizontal direction. The photoelectric conversion portions 201a and 201b are divided in an asymmetrical manner with respect to the pixel center line C, and the area of the photoelectric conversion portion 201b is larger than the area of the photoelectric conversion portion 201a.

The configuration described above may be paraphrased by the following illustration. The photoelectric conversion portion 201a has a first portion and a second portion that is at greater distance from the transfer gate 204a in the second direction (the y-direction) than the first portion is. The photoelectric conversion portion 201b has, in the first direction, a third portion arranged in the same position as the first portion and a fourth portion arranged in the same position as the second portion. That is, the first portion and the third portion are portions divided equally in the first direction by the isolation section 202Ab, and the second and fourth portions are portions divided in an asymmetrical manner by the isolation section 202Aa. In the first direction, a width D1 of the first portion defined by the isolation portion 202A is greater than or equal to a width D3 of the third portion defined by the isolation portion 202A. Further, a width D2 of the second portion defined by the isolation portion 202A is less than a width D4 of the fourth portion defined by the isolation portion 202A. The position of the isolation portion 202A between the first portion and the third portion is different from the position of the isolation portion 202A between the second portion and the fourth portion in the first direction. That is, the first isolation section 202Aa is shifted by the distance d in the first direction (the −x-direction) relative to the third isolation section 202Ac.

The transfer gate polysilicon 204a and 204b function as respective gates of the transfer transistors M1a and M1b. The photoelectric conversion portion 201a and the floating diffusion region 205a share the source/drain regions of the transfer transistor M1a. Applying a voltage to the transfer gate polysilicon 204a causes charges to be transferred from the photoelectric conversion portion 201a to the floating diffusion region 205a. Similarly, the photoelectric conversion portion 201b and the floating diffusion region 205b share the source/drain regions of the transfer transistor M1b. Applying a voltage to the transfer gate polysilicon 204b causes charges to be transferred from the photoelectric conversion portion 201b to the floating diffusion region 205b.

A part of each of the transfer gate polysilicon 204a and 204b overlaps with each of the photoelectric conversion portions 201a and 201b in a planar view. Respective width directions of the transfer gate polysilicon 204a and 204b are the same. A width W1 of a portion where the first photoelectric conversion portion 201a overlaps with the first transfer gate polysilicon 204a is equal to a width W2 of a portion where the second photoelectric conversion portion 201b overlaps with the second transfer gate polysilicon 204b. This allows for substantially the same charge transfer characteristics between the transfer transistors M1a and M1b. That is, it is possible to maintain the symmetry of charge transfer characteristics while dividing the photoelectric conversion portions 201a and 201b in an asymmetrical manner.

FIG. 4B illustrates a pupil division pattern of the pixel 20B of the second pixel group. The photoelectric conversion portions 201a (R2a, G2a, B2a) and 201b (R2b, G2b, B2b) are divided by an isolation portion 202B. The isolation portion 202B comprises isolation sections 202Ba to 202Bc. Unlike the case of FIG. 4A, the first isolation section 202Ba is located decentered by the distance d in the +x-direction with respect to the pixel center line C. The second isolation section 202Bb is located on the pixel center line C, and the third isolation section 202Bc connects the first isolation section 202Ba to the second isolation section 202Bb. Also in FIG. 4B, the width W1 of the overlapping portion is equal to the width W2 of the overlapping portion. Further, the relationships among the first to fourth portions described in detail with respect to FIG. 4A can similarly apply to the case of FIG. 4B with interpretation of the photoelectric conversion portions 201a and 201b being replaced with each other.

FIG. 4C illustrates a pupil division pattern of the pixel 20C of the third pixel group. The photoelectric conversion portions 201a (R3a, G3a, B3a) and 201b (R3b, G3b, B3b) are divided at the center of the pixel by an isolation portion 202C in the horizontal direction. The isolation portion 202C has a straight shape and is located on the pixel center line C. Also in FIG. 4C, the width W1 of the overlapping portion is equal to the width W2 of the overlapping portion.

In FIG. 4A to FIG. 4C, focus detection is enabled by separately reading out signals that are based on charges of the photoelectric conversion portions 201a and 201b. On the other hand, formation of a signal of a normal captured image is enabled by combining signals that are based on charges of the photoelectric conversion portions 201a and 201b.

Figure 5A:
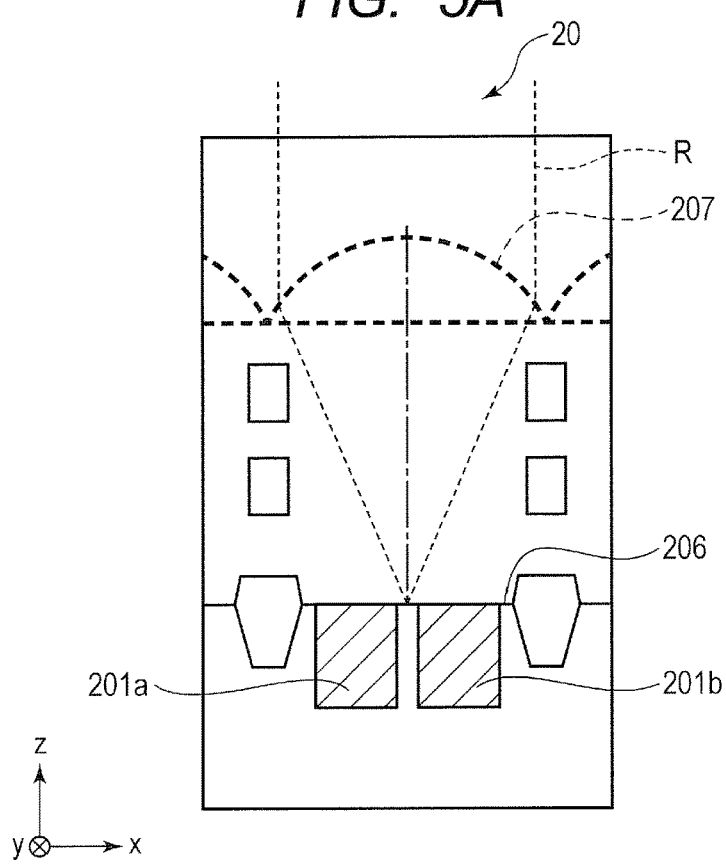
FIG. 5A, FIG. 5B and FIG. 5C are diagrams illustrating focus detection using a pupil division phase difference scheme of the first embodiment.
Figure 5B:
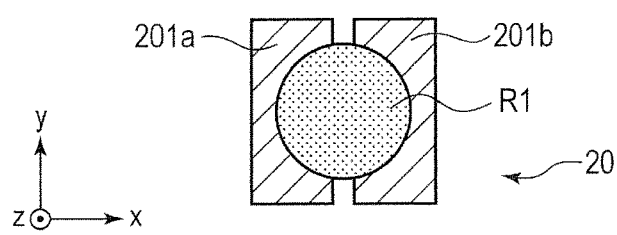
Figure 5C:
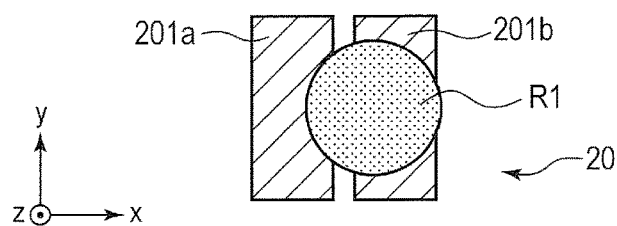

FIG. 5A to FIG. 5C are diagrams illustrating focus detection using a pupil division phase difference scheme. FIG. 5A illustrates a schematic sectional view of the pixel 20 in the present embodiment. The pixel 20 forms a solid state imaging device of a pupil division phase difference scheme, and a single micro lens 207 is formed over (in the +z-direction) of the paired photoelectric conversion portions 201a and 201b. The imaging optics (101 to 105) of FIG. 1 are further provided above the micro lens 207. A light flux R from the imaging optics is guided to a light receiving surface 206 via the micro lens 207.

FIG. 5B and FIG. 5C are diagrams of the light receiving surface 206 when viewed from the imaging optics (from the +z-direction). The light flux R is concentrated by the micro lens 207 and projected as an exit pupil image R1 on the light receiving surface 206. In order to perform accurate focus detection in a solid state imaging device of a pupil division phase difference scheme, it is necessary to divide an incident light flux from imaging optics into pupils in a symmetrical manner and guide the divided light fluxes to the paired photoelectric conversion portions 201a and 201b. FIG. 5B illustrates the pixel 20 located at substantially the center of an image capturing region. In this pixel 20, the exit pupil image R1 is divided substantially equally and projected on the paired photoelectric conversion portions 201a and 201b. In this case, respective charges generated in the photoelectric conversion portions 201a and 201b are substantially equal. FIG. 5C illustrates the pixel 20 located at the end of the image capturing region. In this pixel, the exit pupil image R1 is divided and projected on the paired photoelectric conversion portions 201a and 201b in an asymmetrical manner, and therefore a difference occurs between respective charges generated in the photoelectric conversion portions 201a and 201b. That is, signals read out from the pixels 20 are different depending on the position of the pixel 20 in the image capturing region, and this results in a reduction in the focus detection accuracy. In particular, when a high incident-angle light enters a short pupil distance lens, a poor symmetry of the exit pupil image R1 in the pixels 20 located at the end of the capturing region makes it difficult to perform focus detection.

To address this problem, the imaging device of the present embodiment has the first to third pixel groups that are different in the dividing position of the photoelectric conversion portions 201a and 201b. In the pixel 20A of the first pixel group, the photoelectric conversion portions 201a and 201b are divided by the isolation portion 202A decentered in the −x-direction from the pixel center. Further, in the pixel 20B of the second pixel group, the photoelectric conversion portions 201a and 201b are divided by the isolation portion 202B decentered in the +x-direction from the pixel center line C. Further, in the pixel 20C of the third pixel group, the photoelectric conversion portions 201a and 201b are divided by the isolation portion 202C at the pixel center. According to the present embodiment, a reduction in the focus detection accuracy can be suppressed by properly selecting pixel signals of the first to third pixel groups in accordance with the decentering position of the exit pupil image R1.

For example, when the exit pupil image R1 is shifted in the +x-direction as illustrated in FIG. 5C, focus detection is performed by using the signal from the pixel 20B of the second pixel group. The photoelectric conversion portions 201a and 201b of the pixel 20B are divided at the position decentered in the +x-direction. Since the exit pupil image R1 is projected on the photoelectric conversion portions 201a and 201b in a symmetrical manner, a use of the signal of the pixel 20B of the second pixel group for focus detection allows for maintaining the focus detection accuracy.

On the other hand, when the exit pupil image R1 is shifted in the −x-direction, focus detection is performed by using the signal from the pixel 20A of the first pixel group. Since the photoelectric conversion portions 201a and 201b of the pixel 20A are divided at the position decentered in the −x-direction, the exit pupil image R1 is projected on the photoelectric conversion portions 201a and 201b in a symmetrical manner. Therefore, also in this case, the focus detection accuracy can be maintained. Note that selection of the first to third pixel groups may be performed by the CPU 114 and/or the DSP 109 illustrated in FIG. 1.

Moreover, in the present embodiment, the pixels 20A to 20C of the first to third pixel groups have the same widths W1 and W2 of the portions where the photoelectric conversion portions 201a and 201b overlap with the transfer gate polysilicon 204a and 204b, respectively. That is, the width W1 in the direction crossing a charge transfer direction of a portion where the photoelectric conversion portion 201a overlaps with the transfer gate polysilicon 204a is equal to the width W2 in the direction crossing a charge transfer direction of a portion where the photoelectric conversion portion 201b overlaps with the transfer gate polysilicon 204b. This can suppress the charge transfer characteristics from being asymmetrical, even when the dividing position between the photoelectric conversion portions 201a and 201b is decentered. This allows for obtaining substantially the same capturing characteristics as those of a solid state imaging device with a pupil division phase difference scheme comprising only pixels each of which has the equally divided photoelectric conversion portions. Note that the widths W1 and W2 may not necessarily be the same and, as long as the difference between the widths W1 and W2 is smaller than the difference (the distance d) between the length of the first photoelectric conversion portion 201a in the x-direction and the length of the second photoelectric conversion portion 201b in the x-direction, a decrease in the symmetry of the charge transfer characteristics can be reduced.

Figure 9A:
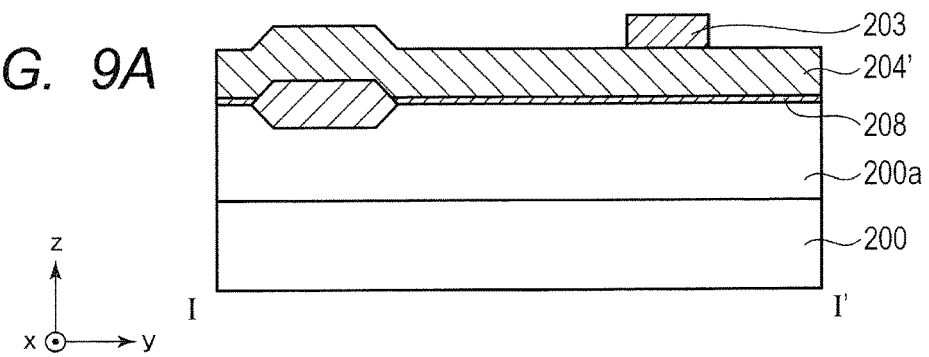
FIG. 9A, FIG. 9B, FIG. 9C and FIG. 9D are diagrams illustrating a manufacturing method of the imaging device of the first embodiment.
Figure 9B:
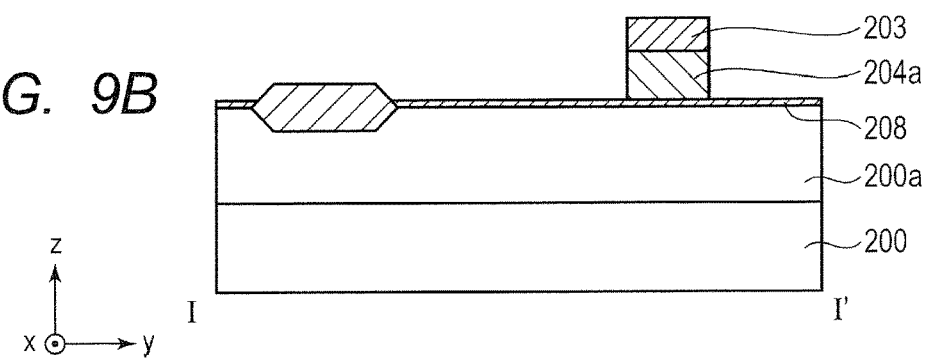
Figure 9C:
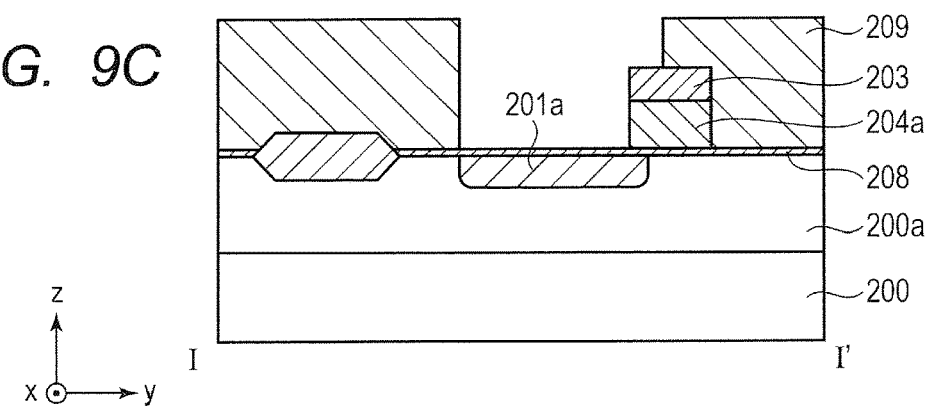
Figure 9D:
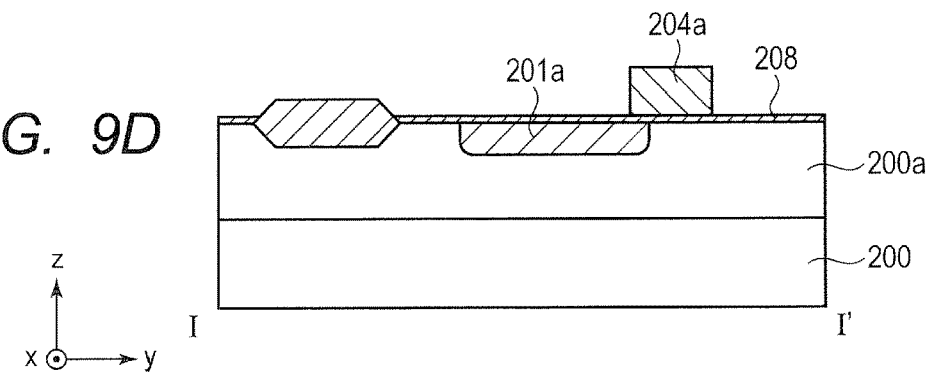
Figure 10A:
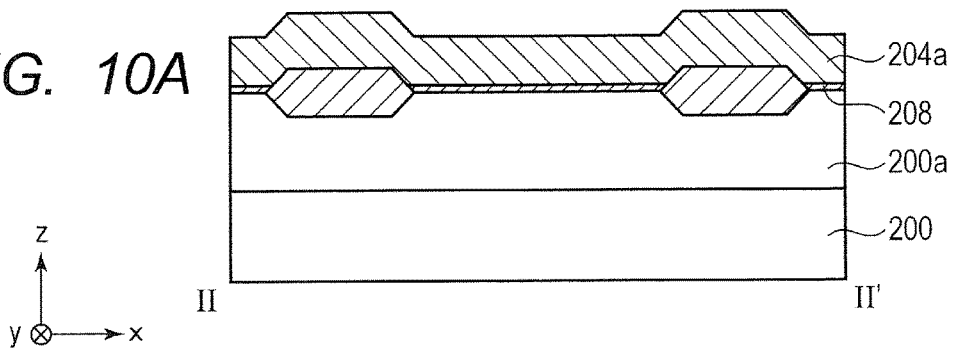
FIG. 10A, FIG. 10B, FIG. 10C and FIG. 10D are diagrams illustrating the manufacturing method of the imaging device of the first embodiment.

Next, a manufacturing method of the imaging device of the present embodiment will be described by using FIG. 9A to FIG. 11. FIG. 9A to FIG. 9D each illustrate a cross section along the line I-I' of FIG. 4A, and FIG. 10A to FIG. 10D each illustrate a cross section along the line II-II' of FIG. 4A. The semiconductor substrate 200 is a silicon semiconductor substrate, for example, and a P-type semiconductor well 200a, for example, is formed in a capturing region of the semiconductor substrate 200. After a device isolation portion is formed in the semiconductor substrate 200, a gate oxide film 208 and a polysilicon film 204' are deposited. Next, a photoresist is applied, exposed, and developed on the polysilicon film 204' to form a photoresist pattern 203 (FIG. 9A, FIG. 10A).

Figure 10B:
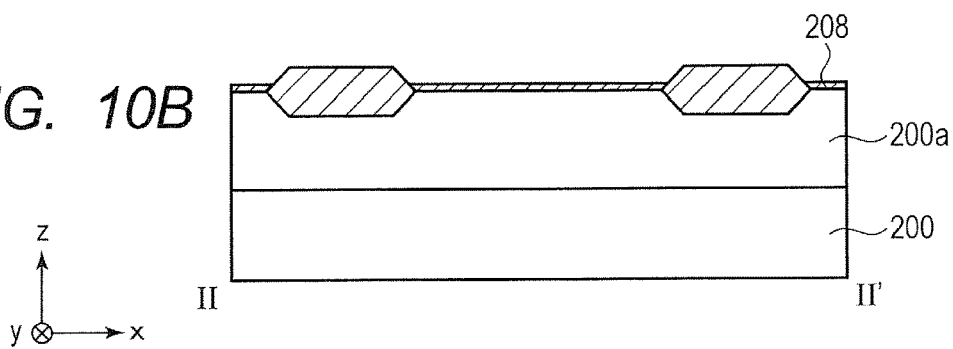
Figure 10C:
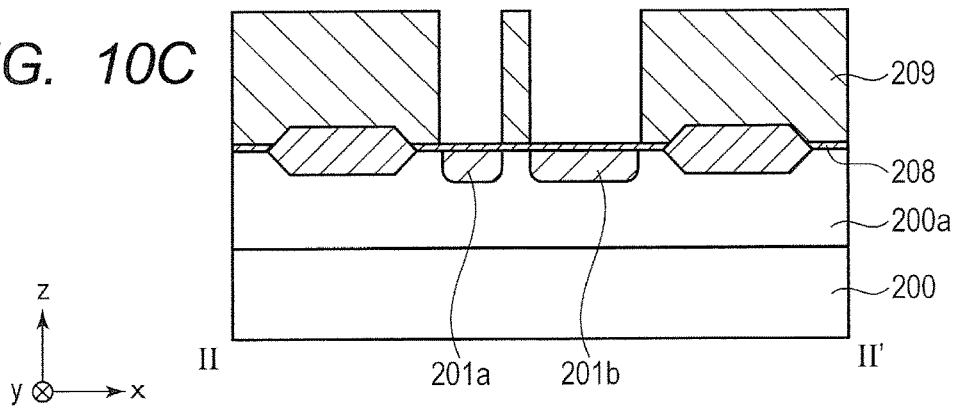
Figure 10D:
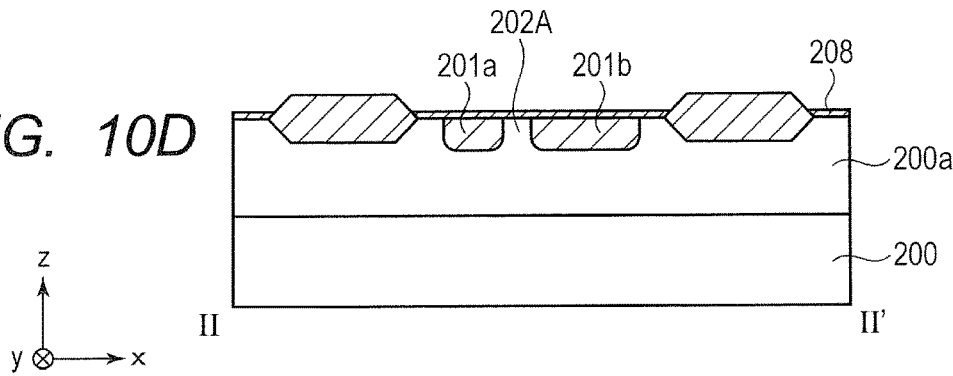

Next, the polysilicon film 204' is etched by using the photoresist pattern 203 as a mask and patterned in a similar manner to the photoresist pattern 203. Thereby, the transfer gate polysilicon 204a is formed (FIG. 9B, FIG. 10B). Next, a photoresist pattern 209 is formed as an ion implantation mask for forming the photoelectric conversion portions 201a and 201b. The photoresist pattern 209 is formed so as to cover a part of the substrate and has openings used for forming the photoelectric conversion portions 201a and 201b. An ion implantation is performed by using the photoresist patterns 203 and 209 as masks to form the photoelectric conversion portions 201a and 201b (FIG. 9C, FIG. 10C). As illustrated in FIG. 10C, no ion is implemented under the photoresist pattern 209 between the openings, and thus the isolation portion 202A dividing the photoelectric conversion portions 201a and 201b is formed. The photoresist patterns 203 and 209 are then removed (FIG. 9D, FIG. 10D). Furthermore, as illustrated in FIG. 5A, an insulating film, a shield film, a wiring layer, vias, micro lenses, a passivation layer, and the like are formed to obtain the pixels 20A to 20C.

Figure 11:
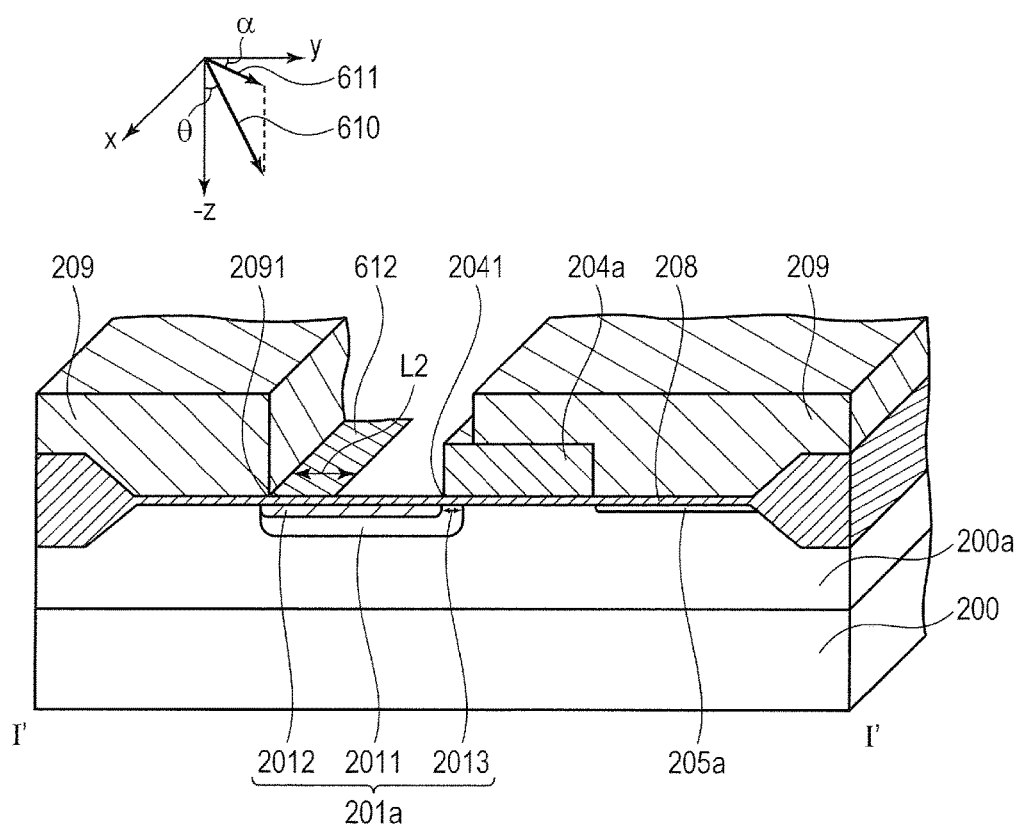
FIG. 11 is a diagram illustrating an ion implantation process in forming a photoelectric conversion portion of the first embodiment.

FIG. 11 illustrates an ion implantation process when the photoelectric conversion portions 201a and 201b are formed in FIG. 9C and FIG. 10C, and illustrates a cross section along the line I-I' of FIG. 4A and FIG. 4B. In the well 200a, an accumulation region 2011 of the photoelectric conversion portion 201a and the drain region (the floating diffusion region) 205 of the transfer transistor M1 are formed. The accumulation region 2011 is formed of an N-type semiconductor, and the surface thereof is covered with a dense P-type semiconductor layer 2012. A charge transferring region 2013 functions as the source of the transfer transistor M1 that transfers charges of the accumulation region 2011 to the drain (the floating diffusion region) 205a. The gate oxide film 208 is a silicon oxide film, for example, and is formed so as to cover the photoelectric conversion portions 201a and 201b and the drain (the floating diffusion region) 205. The transfer gate polysilicon 204a is formed on the gate oxide film 208, and a part of the transfer gate polysilicon 204a overlaps with the charge transferring region 2013 of the photoelectric conversion portion 201a in a planar view.

The photoresist pattern 209 is a mask in an ion implantation process for forming the accumulation region 2011 and the charge transferring region 2013 of the photoelectric conversion portion 201a. As illustrated here in FIG. 11, a normal direction of the semiconductor substrate 200 is defined as a z-axis, the gate length direction of the transfer gate polysilicon 204a is defined as a y-axis, and the gate width direction is defined as an x-axis.

In the present embodiment, the charge transferring region 2013 is formed in a self-aligning manner with respect to the transfer gate polysilicon 204a, and the ion implantation is performed from an implantation direction 610, which is tilted by a predetermined angle and thus is not 0 degree relative to the z-axis. With ion implantation from the tilted implantation direction 610, however, no ion is implemented to a region 612 behind the photoresist pattern 209.

A length L2 in the y-direction of the region 612 is expressed by h×tan θ×cos α, where an angle (tilt angle) of the implantation direction 610 relative to the negative direction of the z-axis is denoted as θ, the angle of a vector 611, which is a projected vector on the xy-plane of the implantation direction 610, relative to the positive direction of the y-axis is denoted as α, and a film thickness of the photoresist pattern 209 is denoted as h. Therefore, in order to form the charge transferring region 2013, it is preferable that at least the distance between an edge 2041 of the transfer polysilicon 204 and an edge 2091 of the photoresist pattern 209 be greater than the length L2 expressed by h×tan θ×cos α. The length L2 corresponds to the length L1 of each of the second isolation sections 202Ab and 202Bb, which divides the photoelectric conversion portions into equal parts, of the isolation portions 202A and 202B of FIG. 4A and FIG. 4B. That is, it is preferable that the length L1 of each of the second isolation sections 202Ab and 202Bb of the isolation portions 202A and 202B be greater than the length L2 expressed by h×tan θ×cos α.

The pixels 20A to 20C obtained in such a way has the following configuration. That is, (i) the position of at least a part of the isolation portions in the pixels 20A to 20C of the first to third pixel groups is shifted in the dividing direction relative to the position of at least a part of the isolation portion in the pixels of remaining pixel groups. (ii) Respective widths of the portions where a plurality of photoelectric conversion portions 201a and 201b overlap with a plurality of transfer gate polysilicon 204a and 204b in a planar view are the same. (iii) The isolation portions 202A and 202B include the first isolation sections 202Aa and 202Ba and the second isolation sections 202Ab and 202Bb, respectively, the second isolation sections 202Ab and 202Bb are located closer to the transfer gate polysilicon than the first isolation sections 202Aa and 202Ba are, and each of the second isolation sections 202Ab and 202Bb equally divides the photoelectric conversion portions 201a and 201b.

According to the present embodiment, while providing pixel groups having different dividing positions of the photoelectric conversion portions, it is possible to suppress degradation of charge transfer characteristics which would otherwise be caused due to the decentrization of the dividing positions of the photoelectric conversion portions. Further, the manufacturing method of the imaging device according to the present embodiment allows for optimum design of the length of respective sections of the isolation portion in accordance with the angle of ion implantation.

Second Embodiment

Figure 6A:
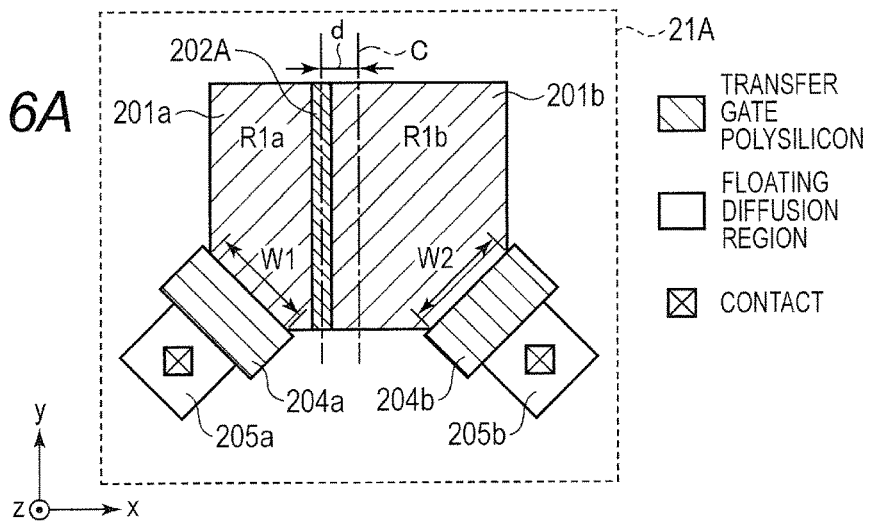
FIG. 6A, FIG. 6B and FIG. 6C are schematic diagrams of a pupil division pattern of a second embodiment.
Figure 6B:
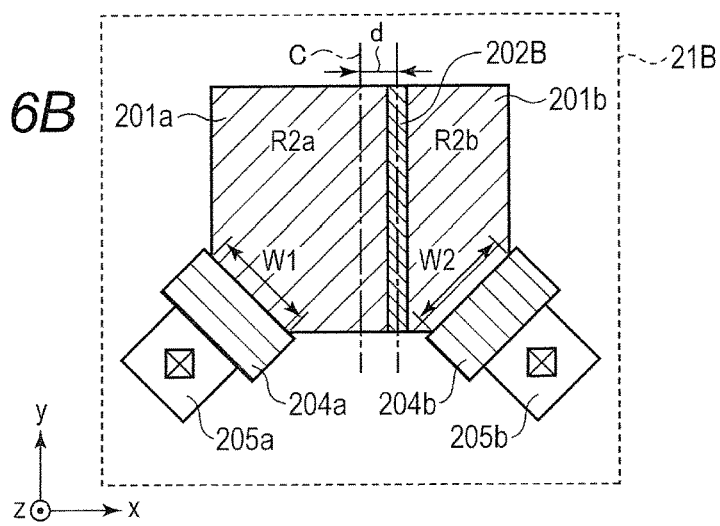
Figure 6C:
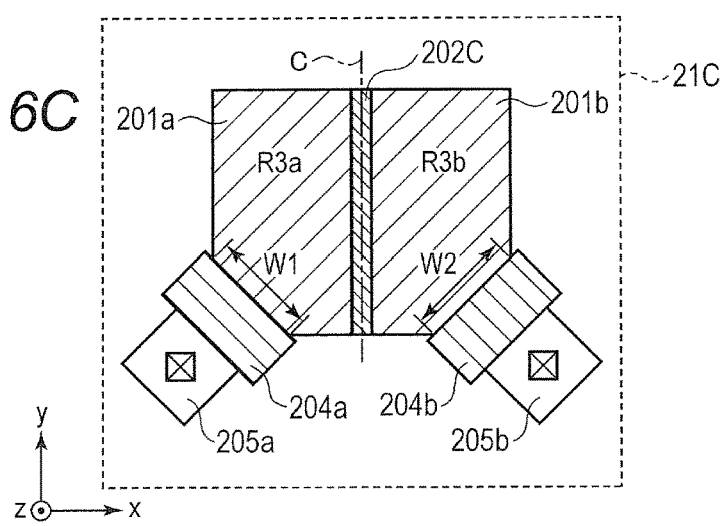

An imaging device of the second embodiment will be described mainly for configurations different from those of the first embodiment. FIG. 6A to FIG. 6C are schematic diagrams of dividing patterns of a pixel of an image capturing pixel group in the second embodiment and each illustrate a part of the pixel in a planar view. FIG. 6A illustrates a pixel 21A of a first pixel group, FIG. 6B illustrates a pixel 21B of a second pixel group, and FIG. 6C illustrates a pixel 21C of a third pixel group. In a similar manner to the first embodiment, the photoelectric conversion portions 201a and 201b are divided in the horizontal direction (the x-direction) by isolation portions 202A, 202B, and 202C. The isolation portion 202A is decentered by the distance d in the −x-direction from the pixel center line C, and the isolation portion 202B is decentered by the distance d in the +x-direction from the pixel center line C. Further, the isolation portion 202C is located on the pixel center line C.

In the present embodiment, the isolation portions 202A and 202B of the first and second pixel groups have a straight shape similarly to the isolation portion 202C of the third pixel group. The transfer gate polysilicon 204a and 204b are arranged with an angle of 45 degrees relative to the x-direction and the y-direction, respectively, and respective width directions thereof are orthogonal to each other. Further, the transfer gate polysilicon 204a and 204b overlap with respective corners of the photoelectric conversion portions 201a and 201b in a planar view. The width W1 of a portion where the first photoelectric conversion portion 201a overlaps with the first transfer gate polysilicon 204a is equal to the width W2 of a portion where the second photoelectric conversion portion 201b overlaps with the second transfer gate polysilicon 204b. This allows for substantially the same characteristics of charge transfer of the transfer transistors M1a an M1b. That is, while dividing the photoelectric conversion portions 201a and 201b in an asymmetrical manner, it is possible to maintain the symmetry of charge transfer characteristics. Note that, with the difference of widths W1 and W2 being less than the distance d, a decrease in the symmetry of charge transfer characteristics can be reduced.

Also in the present embodiment, a reduction of the focus detection accuracy can be suppressed by properly selecting pixel signals of the first to third pixel groups in accordance with a decentering state of an exit pupil image. When an exit pupil image is shifted in the +x-direction, the pixel signal of the second pixel group can be used to perform focus detection. Further, when an exit pupil image is shifted in the −x-direction, the pixel signal of the first pixel group can be used to perform focus detection. In such a way, a proper selection of the first to third pixel groups in accordance with a decentering state of an exit pupil image allows the exit pupil image to be projected on the photoelectric conversion portions 201a and 201b in a symmetrical manner to maintain the focus detection accuracy.

In the present embodiment, the isolation portion 202A of the first pixel group and the isolation portion 202B of the second pixel group each have a straight shape, and each of the entire isolation portions 202A and 202B is decentered by the distance d from the pixel center line C. The length of a portion decentered from the pixel center line C of the isolation portions 202A and 202B is longer than the length of the first isolation sections 202Aa and 202Bb in the first embodiment. The dividing position of the photoelectric conversion portions 201a and 201b with respect to the pixel center line C is constant in the y-direction, which can enhance the advantage of maintaining the symmetry of pupil division against a shift of the exit pupil image in the x-direction.

Third Embodiment

Figure 7:
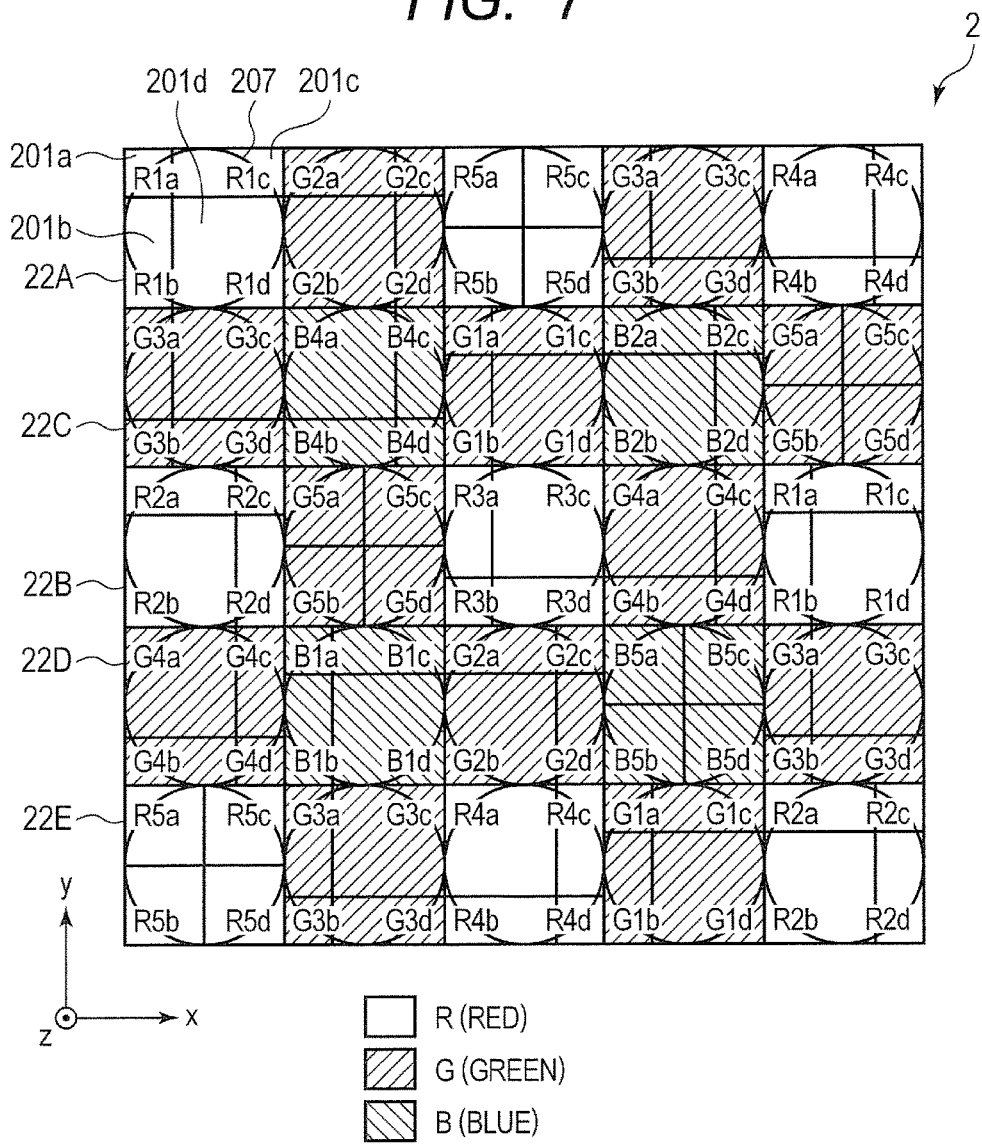
FIG. 7 is a schematic diagram of a pixel arrangement of a pixel unit of a third embodiment.

An imaging device of the third embodiment will be described mainly for configurations different from those of the first and second embodiments. FIG. 7 is a schematic diagram of a pixel arrangement of the pixel unit 2 in the third embodiment and illustrates pixels 22 of five columns by five rows. Each pixel 22 has first to fourth photoelectric conversion portions 201a to 201d quartered by isolation portions and the micro lens 207 depicted with a circle, and R, G, and B color filters are arranged to respective pixels 22 according to the Bayer arrangement. Each R pixel 22 has the first photoelectric conversion portion 201a (R1a to R5a), the second photoelectric conversion portion 201b (R1b to R5b), a third photoelectric conversion portion 201c (R1c to R5c), and a fourth photoelectric conversion portion 201d (R1d to R5d). Each G pixel 22 has the first photoelectric conversion portion 201a (G1a to G5a), the second photoelectric conversion portion 201b (G1b to G5b), the third photoelectric conversion portion 201c (G1c to G5c), and the fourth photoelectric conversion portion 201d (G1d to G5d). Further, each B pixel 22 has the first photoelectric conversion portion 201a (B1a to B5a), the second photoelectric conversion portion 201b (B1b to B5b), the third photoelectric conversion portion 201c (B1c to B5c), and the fourth photoelectric conversion portion 201d (B1d to B5d) (B3a, B3b, B3c, and B3d are not depicted). Note that the advantage of the present invention can be obtained in a case of a monochrome imaging device, and thus color filters are not necessarily required.

FIG. 8A to FIG. 8E are schematic diagrams of pupil division patterns of the pixel of the third embodiment and each illustrate a part of the pixel in a planar view. In the present embodiment, the photoelectric conversion unit 201 of each pixel 22 is divided into four, and a pixel signal of each of the divided photoelectric conversion portions 201a to 201d can be read out separately via transfer transistors.

As illustrated in FIG. 8A to FIG. 8E, the pixel unit 2 is formed of five types of pixel groups that are different in the dividing pattern.

Figure 8A:
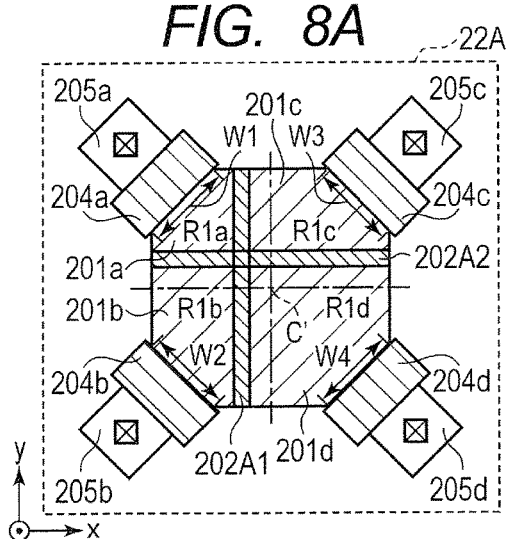
FIG. 8A, FIG. 8B, FIG. 8C, FIG. 8D and FIG. 8E are schematic diagrams of a pupil division pattern of the third embodiment.

FIG. 8A illustrates a pixel 22A of the first pixel group. The photoelectric conversion unit 201 is divided into four by a first isolation portion 202A1 and a second isolation portion 202A2. The isolation portions 202A1 and 202A2 are orthogonal to each other and intersect at a position shifted in the −x-direction and the +y-direction from the pixel center C' (the center of the photoelectric conversion unit 201). The first isolation portion 202A1 divides the photoelectric conversion unit 201 into two in the x-direction (the first direction), and the second isolation portion 202A2 divides the photoelectric conversion unit 201 into two in the y-direction (the second direction). That is, the photoelectric conversion unit 201 has the first photoelectric conversion portion 201a (R1a, G1a, B1a), the second photoelectric conversion portion 201b (R1b, G1b, B1b), the third photoelectric conversion portion 201c (R1c, G1c, B1c), and the fourth photoelectric conversion portion 201d (R1d, G1d, B1d). The first photoelectric conversion portion 201a has the smallest light receiving area in the four photoelectric conversion portions 201a to 201d, and the fourth photoelectric conversion portion 201d is the largest in the four photoelectric conversion portions 201a to 201d. Each of the second photoelectric conversion portion 201b and the third photoelectric conversion portion 201c is larger than the first photoelectric conversion portion 201a and smaller than the fourth photoelectric conversion portion 201d. Further, the second photoelectric conversion portion 201b and the third photoelectric conversion portion 201c have substantially the same light receiving area.

The first to fourth transfer gate polysilicon 204a to 204d are arranged inclined by an angle of 45 degrees relative to the x-direction and the y-direction and overlap with respective corners of the photoelectric conversion portions 201a to 201d in a planar view. The first transfer polysilicon 204a and the fourth transfer gate polysilicon 204d are arranged in parallel, and the second transfer gate polysilicon 204b and the third transfer gate polysilicon 204c are arranged in parallel. The widths W1 to W4 of portions where the first to fourth photoelectric conversion portions 201a to 201d overlap with the first to fourth transfer gate polysilicon 204a to 204d, respectively, are the same as each other. It is therefore possible to maintain the symmetry of charge transfer characteristics while dividing the photoelectric conversion portions 201a to 201d in an asymmetrical manner.

Figure 8D:
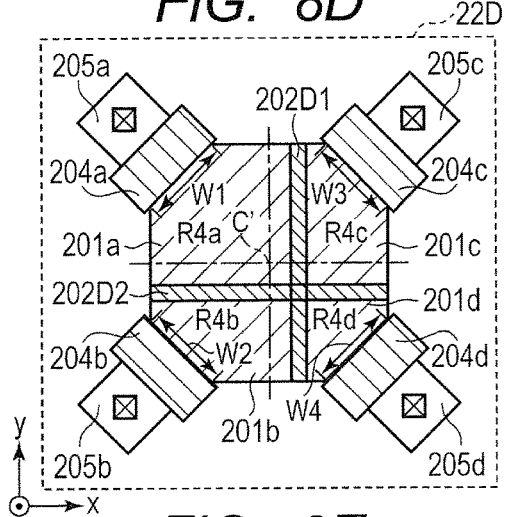
Figure 8B:
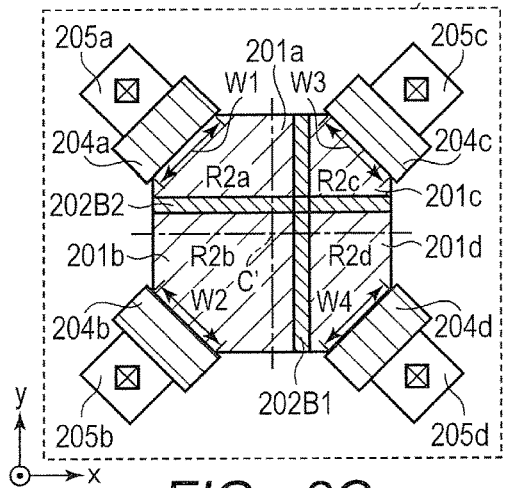

FIG. 8B illustrates a pixel 22B of the second pixel group. A first isolation portion 202B1 and a second isolation portion 202B2 intersect at a position shifted in the +x-direction and the +y-direction from the pixel center C' and divide the photoelectric conversion unit 201 into two in the x-direction and the y-direction, respectively. The pixel 22B of the second pixel group has the first photoelectric conversion portion 201a (R2a, G2a, B2a), the second photoelectric conversion portion 201b (R2b, G2b, B2b), the third photoelectric conversion portion 201c (R2c, G2c, B2c), and the fourth photoelectric conversion portion 201d (R2d, G2d, B2d). The second photoelectric conversion portion 201b has the largest light receiving area in the four photoelectric conversion portions, and the third photoelectric conversion portion 201c has the smallest light receiving area in the four photoelectric conversion portions. The first photoelectric conversion portion 201a and the fourth photoelectric conversion portion 201d have substantially the same light receiving area.

Figure 8E:
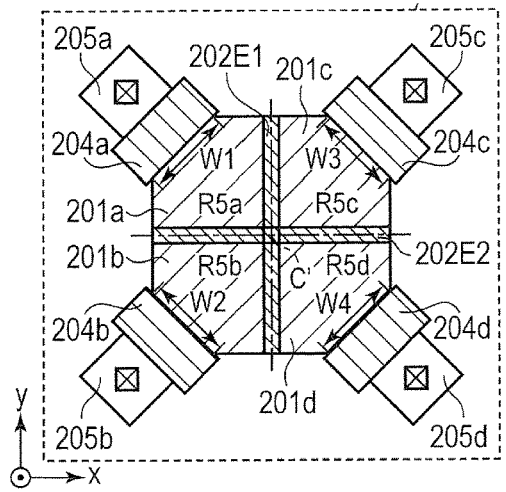
Figure 8C:
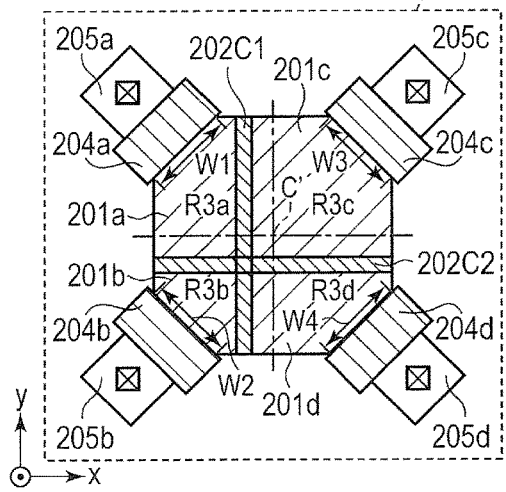

FIG. 8C illustrates a pixel 22C of the third pixel group. A first isolation portion 202C1 and a second isolation portion 202C2 intersect at a position shifted in the −x-direction and the −y-direction from the pixel center C' and divide the photoelectric conversion unit 201 into two in the x-direction and the y-direction, respectively. The pixel 22C of the third pixel group has the first photoelectric conversion portion 201a (R3a, G3a, B3a), the second photoelectric conversion portion 201b (R3b, G3b, B3b), the third photoelectric conversion portion 201c (R3c, G3c, B3c), and the fourth photoelectric conversion portion 201d (R3d, G3d, B3d). The third photoelectric conversion portion 201c has the largest light receiving area in the four photoelectric conversion portions, and the second photoelectric conversion portion 201b has the smallest light receiving area in the four photoelectric conversion portions. The first photoelectric conversion portion 201a and the fourth photoelectric conversion portion 201d have substantially the same light receiving area.

FIG. 8D illustrates a pixel 22D of the fourth pixel group. A first isolation portion 202D1 and a second isolation portion 202D2 intersect at a position shifted in the +x-direction and the −y-direction from the pixel center C' and divide the photoelectric conversion unit 201 into two in the x-direction and the y-direction, respectively. The pixel 22D of the fourth pixel group has the first photoelectric conversion portion 201a (R4a, G4a, B4a), the second photoelectric conversion portion 201b (R4b, G4b, Bb), the third photoelectric conversion portion 201c (R4c, G4c, B4c), and the fourth photoelectric conversion portion 201d (R4d, G4d, B4d). The first photoelectric conversion portion 201a has the largest light receiving area in the four photoelectric conversion portions, and the fourth photoelectric conversion portion 201d has the smallest light receiving area in the four photoelectric conversion portions. The second photoelectric conversion portion 201b and the third photoelectric conversion portion 201c have substantially the same light receiving area.

FIG. 8E illustrates a pixel 22E of the fifth pixel group. A first isolation portion 202E1 and a second isolation portion 202E2 intersect at the pixel center C' and divide the photoelectric conversion unit 201 into two in the x-direction and the y-direction, respectively. The pixel 22E of the fifth pixel group has the first photoelectric conversion portion 201a (R5a, G5a, B5a), the second photoelectric conversion portion 201b (R5b, G5b, B5b), the third photoelectric conversion portion 201c (R5c, G5c, B5c), and the fourth photoelectric conversion portion 201d (R5d, G5d, B5d). The first to fourth photoelectric conversion portions 201a to 201d have substantially the same light receiving area.

In the imaging device illustrated in FIG. 7 and FIG. 8A to FIG. 8E, focus detection can be performed by separately reading out pixel signals obtained from the first to fourth photoelectric conversion portions 201a to 201d. On the other hand, a normal captured image can be formed by combining and reading out pixel signals obtained from the first photoelectric conversion portion 201a (R1a, G1a, B1a), the second photoelectric conversion portion 201b (R1b, G1b, B1b), the third photoelectric conversion portion 201c (R1c, G1c, B1c), and the fourth photoelectric conversion portion 201d (R1d, G1d, B1d) in the first pixel group. In a similar manner in the second to fifth pixel groups, a normal captured image can be formed by combining and reading out pixel signals obtained from the first to fourth photoelectric conversion portions 201a to 201d.

The photoelectric conversion portions 201a to 201d of the first to fourth pixel groups of the imaging device of the present embodiment are divided by the first isolation portions 202A1 to 202D1 at a position decentered in the +x-direction or −x-direction from the pixel center C'. For example, when the exit pupil image R1 is shifted in the +x-direction as illustrated in FIG. 5C, focus detection is performed by using pixel signals from the second or fourth pixel group. Since the photoelectric conversion units 201 in the pixel 22B of the second pixel group and in the pixel 22D of the fourth pixel group are divided at the position decentered in the +x-direction, the exit pupil image R1 is projected in a symmetrical manner on the photoelectric conversion portions 201a and 201b and on the photoelectric conversion portions 201c and 201d. Thereby, the focus detection accuracy can be maintained. On the other hand, when the exit pupil image R1 is shifted in the −x-direction, the focus detection accuracy can be maintained through focus detection by using pixel signals of the first pixel group or the third pixel group comprising pixels in each of which the dividing position of the photoelectric conversion portions is decentered in the −x-direction.

Further, the photoelectric conversion unit 201 of the imaging device of the present embodiment is divided by the second isolation portions 202A2 to 202D2 at a position decentered in the +y-direction or the −y-direction from the pixel center C'. For example, when the exit pupil image R1 is shifted in the +y-direction, the focus detection accuracy can be maintained through focus detection by using pixel signals of the first or second pixel group comprising pixels in each of which the dividing position of the photoelectric conversion unit 201 is decentered in the +y-direction. On the other hand, when the exit pupil image R1 is shifted in the −y-direction, the focus detection accuracy can be maintained through focus detection by using pixel signals of the third or fourth pixel group comprising pixels in each of which the dividing position of the photoelectric conversion unit 201 is decentered in the −y-direction.

In the present embodiment, the widths W1 to W4 of portions where the photoelectric conversion portions 201a to 201d overlap with the transfer gate polysilicon 204a to 204d, respectively, are the same. This can suppress degradation of charge transfer characteristics which would otherwise be caused due to decentering of the dividing positions of the photoelectric conversion portions 201a to 201d. This allows for obtaining substantially the same capturing characteristics as those of an imaging device with a pupil division phase difference scheme comprising only pixels in each of which the photoelectric conversion unit 201 is divided equally in the x-direction and the y-direction. In addition, a decrease in the symmetry of charge transfer characteristics can be reduced by reducing the difference of the widths W1 to W4 compared to the difference between the first isolation portions 202A1 to 202D1 and the virtual center and the difference between the second isolation portions 202A2 to 202D2 and the pixel center C'.

Other Embodiments

Any of the embodiments described above is intended to merely illustrate an embodied example of the present invention, and the technical scope of the present invention shall not be construed in a limiting sense by these embodiments. That is, the present invention can be implemented in various ways without departing from the technical concept or the primary features thereof. For example, the CMOS transistor may be any of the N-type or P-type. The number of divisions and the direction of division of the photoelectric conversion portions are not limited to those in the embodiments described above.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2016-086156, filed Apr. 22, 2016, which is hereby incorporated by reference herein in its entirety.

What is claimed is:

1. An imaging device comprising:
a plurality of pixels each including a first photoelectric conversion portion, a second photoelectric conversion portion, a third photoelectric conversion portion and a fourth photoelectric conversion portion, a first transfer gate that transfers charges of the first photoelectric conversion portion, a second transfer gate that transfers charges of the second photoelectric conversion portion, a third transfer gate that transfers charges of the third photoelectric conversion portion and a fourth transfer gate that transfers charges of the fourth photoelectric conversion portion, and an amplification transistor; and
a plurality of microlenses each covering the first photoelectric conversion portion, the second photoelectric conversion portion, the third photoelectric conversion portion and the fourth photoelectric conversion portion of a corresponding pixel of the plurality of pixels, wherein, the first photoelectric conversion portion and the second photoelectric conversion portion are arranged adjacent along a first direction,
the third photoelectric conversion portion and the fourth photoelectric conversion portion are arranged adjacent along the first direction,
the first photoelectric conversion portion and the third photoelectric conversion portion are arranged adjacent along a second direction,
the second photoelectric conversion portion and the fourth photoelectric conversion portion are arranged adjacent along the second direction,
each of the first transfer gate, the second transfer gate, the third transfer gate and the fourth transfer gate is arranged so that a channel width direction crosses both the first direction and the second direction,
the amplification transistor is shared by the first photoelectric conversion portion, the second photoelectric conversion portion, the third photoelectric conversion portion, and the fourth photoelectric conversion portion covered with one microlens of the plurality of microlenses, and
the first photoelectric conversion portion, the second photoelectric conversion portion, the third photoelectric conversion portion and the fourth photoelectric conversion portion covered with the one microlens are arranged in one active region.

2. The imaging device according to claim 1, wherein,
each of the plurality of pixels includes a first isolation section configured to isolate the first photoelectric conversion portion and the second photoelectric conversion portion and to isolate the third photoelectric conversion portion and the fourth photoelectric conversion portion,
a width of the first photoelectric conversion portion in the first direction is different from a width of the second photoelectric conversion portion in the first direction, and
a width of the third photoelectric conversion portion in the first direction is different from a width of the fourth photoelectric conversion portion in the first direction.

3. The imaging device according to claim 1, wherein,
each of the plurality of pixels includes a second isolation section configured to isolate the first photoelectric conversion portion and the third photoelectric conversion portion and to isolate the second photoelectric conversion portion and the fourth photoelectric conversion portion,
a width of the first photoelectric conversion portion in the second direction is different from a width of the third photoelectric conversion portion in the second direction, and
a width of the second photoelectric conversion portion in the second direction is different from a width of the fourth photoelectric conversion portion in the second direction.

4. The imaging device according to claim 1, wherein,
each of the plurality of pixels includes a first isolation section configured to isolate the first photoelectric conversion portion and the second photoelectric conversion portion and to isolate the third photoelectric conversion portion and the fourth photoelectric conversion portion,
each of the plurality of pixels includes a second isolation section configured to isolate the first photoelectric conversion portion and the third photoelectric conversion portion and to isolate the second photoelectric conversion portion and the fourth photoelectric conversion portion,
a width of the first photoelectric conversion portion in the first direction is different from a width of the second photoelectric conversion portion in the first direction,
a width of the third photoelectric conversion portion in the first direction is different from a width of the fourth photoelectric conversion portion in the first direction,
a width of the first photoelectric conversion portion in the second direction is different from a width of the third photoelectric conversion portion in the second direction, and
a width of the second photoelectric conversion portion in the second direction is different from a width of the fourth photoelectric conversion portion in the second direction.

5. The imaging device according to claim 2, wherein,
the plurality of pixels includes a first pixel and a second pixel,
in the first pixel,
the width of the first photoelectric conversion portion in the first direction is shorter than the width of the second photoelectric conversion portion in the first direction, and
the width of the third photoelectric conversion portion in the first direction is shorter than the width of the fourth photoelectric conversion portion in the first direction, and
in the second pixel,
the width of the first photoelectric conversion portion in the first direction is longer than the width of the second photoelectric conversion portion in the first direction, and
the width of the third photoelectric conversion portion in the first direction is longer than the width of the fourth photoelectric conversion portion in the first direction.

6. The imaging device according to claim 3, wherein,
the plurality of pixels includes a first pixel and a second pixel,
in the first pixel,
the width of the first photoelectric conversion portion in the second direction is shorter than a width of the third photoelectric conversion portion in the second direction, and
the width of the second photoelectric conversion portion in the second direction is shorter than a width of the fourth photoelectric conversion portion in the second direction, and
in the second pixel,
the width of the first photoelectric conversion portion in the second direction is longer than a width of the third photoelectric conversion portion in the second direction, and
the width of the second photoelectric conversion portion in the second direction is longer than a width of the fourth photoelectric conversion portion in the second direction.

7. The imaging device according to claim 1, wherein the first transfer gate, the second transfer gate, the third transfer gate and the fourth transfer gate are located at respective corners of the first photoelectric conversion portion, the second photoelectric conversion portion, the third photoelectric conversion portion and the fourth photoelectric conversion portion.

8. The imaging device according to claim 1, wherein the first transfer gate, the second transfer gate, the third transfer gate and the fourth transfer gate have a same channel width.

9. An imaging system comprising:
the imaging device according to claim 1, and
a signal processing device that processes a signal from the imaging device.

10. The imaging device according to claim 1, wherein each of the first photoelectric conversion portion, the second photoelectric conversion portion, the third photoelectric conversion portion and the fourth photoelectric conversion portion includes an accumulation region formed of a first conductivity type semiconductor, and
a second conductivity type semiconductor are disposed at
a portion between the accumulation region of the first photoelectric conversion portion and the accumulation region of the second photoelectric conversion portion,
a portion between the accumulation region of the third photoelectric conversion portion and the accumulation region of the fourth photoelectric conversion portion, a portion between the accumulation region of the first photoelectric conversion portion and the accumulation region of the third photoelectric conversion portion, and a portion between the accumulation region of the second photoelectric conversion portion and the accumulation region of the fourth photoelectric conversion portion.

11. The imaging device according to claim 10, wherein,
the plurality of pixels include a first pixel and a second pixel,
the plurality of microlenses include a first microlens covering the first pixel and a second microlens covering the second pixel,
a width of the first photoelectric conversion portion in the first direction in a region overlapping the first microlens is different from a width of the first photoelectric conversion portion in a first direction in a region overlapping the second microlens in a planar view.

12. An imaging device comprising:
a plurality of pixels each including a first photoelectric conversion portion, a second photoelectric conversion portion, a third photoelectric conversion portion, a fourth photoelectric conversion portion, a first transfer gate that transfers charges of the first photoelectric conversion portion, a second transfer gate that transfers charges of the second photoelectric conversion portion, a third transfer gate that transfers charges of the third photoelectric conversion portion, a fourth transfer gate that transfers charges of the fourth photoelectric conversion portion, and an amplification transistor; and
a plurality of microlenses each covering the first photoelectric conversion portion, the second photoelectric conversion portion, the third photoelectric conversion portion and the fourth photoelectric conversion portion of a corresponding pixel of the plurality of pixels,
wherein,
the first photoelectric conversion portion and the second photoelectric conversion portion are arranged adjacent along a first direction without interposing an insulating element between the first photoelectric conversion portion and the second photoelectric conversion portion,
the third photoelectric conversion portion and the fourth photoelectric conversion portion are arranged adjacent along the first direction without interposing an insulating element between the third photoelectric conversion portion and the fourth photoelectric conversion portion, the first photoelectric conversion portion and the third photoelectric conversion portion are arranged adjacent along a second direction without interposing an insulating element between the first photoelectric conversion portion and the third photoelectric conversion portion, the second photoelectric conversion portion and the fourth photoelectric conversion portion are arranged adjacent along the second direction without interposing an insulating element between the second photoelectric conversion portion and the fourth photoelectric conversion portion, each of the first transfer gate, the second transfer gate, the third transfer gate and the fourth transfer gate is arranged so that a channel width direction crosses both the first direction and the second direction, and the amplification transistor is shared by the first photoelectric conversion portion, the second photoelectric conversion portion, the third photoelectric conversion portion, and the fourth photoelectric conversion portion covered with one microlens of the plurality of microlenses.

* * * * *